(12) United States Patent
Chardonnens et al.

(10) Patent No.: US 10,302,407 B2
(45) Date of Patent: May 28, 2019

(54) MOTORIZED ORIENTABLE HEAD FOR MEASURING SYSTEM

(71) Applicant: TESA SA, Renens (CH)

(72) Inventors: Julien Chardonnens, Bulle (CH); Pascal Jordil, Ecoteaux (CH); Knut Siercks, Mörschwil (CH); Bernhard Sprenger, Widnau (CH); Benjamin Vullioud, Vufflens-la-Ville (CH)

(73) Assignee: TESA SA, Renens (CH)

( * ) Notice: Subject to any disclaimer, the term of this patent is extended or adjusted under 35 U.S.C. 154(b) by 219 days.

(21) Appl. No.: 15/358,126

(22) Filed: Nov. 21, 2016

(65) Prior Publication Data

US 2017/0191815 A1    Jul. 6, 2017

(30) Foreign Application Priority Data

Dec. 22, 2015    (EP) .................................... 15201836

(51) Int. Cl.
| | | |
|---|---|---|
| *G01B 11/00* | (2006.01) | |
| *G01B 5/012* | (2006.01) | |
| *G01D 5/347* | (2006.01) | |
| *H01L 41/09* | (2006.01) | |
| *H02K 17/02* | (2006.01) | |
| *G01B 21/04* | (2006.01) | |
| *G01B 7/012* | (2006.01) | |

(52) U.S. Cl.
CPC ............. *G01B 5/012* (2013.01); *G01B 7/012* (2013.01); *G01B 11/005* (2013.01); *G01B 21/04* (2013.01); *G01D 5/3473* (2013.01); *H01L 41/09* (2013.01); *H02K 17/02* (2013.01)

(58) Field of Classification Search
CPC ........ G01B 5/012; G01B 5/061; G01B 3/205; G01B 11/007; G01B 21/047; G01B 5/008; G01B 7/012; G01B 11/005
USPC .......................................................... 33/503
See application file for complete search history.

(56) References Cited

U.S. PATENT DOCUMENTS

| 4,875,177 A | * | 10/1989 | Jarman | ................ | G01B 11/005 |
| | | | | | 702/95 |
| 5,083,884 A | | 1/1992 | Miller | | |
| 5,084,981 A | * | 2/1992 | McMurtry | ............. | G01B 7/012 |
| | | | | | 33/1 D |

(Continued)

FOREIGN PATENT DOCUMENTS

| CN | 201188587 Y | 1/2009 |
| EP | 0741420 A2 | 11/1996 |

(Continued)

OTHER PUBLICATIONS

European Search Report dated Dec. 22, 2015 in application No. 15201836.2.

*Primary Examiner* — Yaritza Guadalupe-McCall
(74) *Attorney, Agent, or Firm* — Maschoff Brennan

(57) ABSTRACT

An inclinable measuring head for use in a coordinate measuring machine or in another measure system. The inclinable head has a support element and a probe holder rotatably linked to the support element by a spherical joint that is capable of being rotated about three independent axes. The measuring head further includes a position encoder providing relative orientation of the probe holder with respect to the support element, and an actuator arranged for orienting the probe holder relative to the support element.

17 Claims, 4 Drawing Sheets

(56) References Cited

U.S. PATENT DOCUMENTS

| | | | | |
|---|---|---|---|---|
| 5,319,577 | A | 6/1994 | Lee | |
| 5,848,477 | A * | 12/1998 | Wiedmann | G01B 5/012 33/503 |
| 5,953,687 | A | 9/1999 | Zink | |
| 6,519,860 | B1 * | 2/2003 | Bieg | B23H 7/26 33/1 PT |
| 6,668,466 | B1 * | 12/2003 | Bieg | G01B 5/008 33/1 PT |
| 6,708,420 | B1 * | 3/2004 | Flanagan | G01B 7/012 33/556 |
| 7,100,297 | B2 * | 9/2006 | McMurtry | G01B 7/012 33/556 |
| 7,127,825 | B2 * | 10/2006 | McMurtry | G01B 21/047 33/556 |
| 7,395,606 | B2 * | 7/2008 | Crampton | B25J 13/088 33/503 |
| 7,885,777 | B2 * | 2/2011 | Jonas | G01B 21/042 33/503 |
| 8,099,877 | B2 * | 1/2012 | Champ | B25J 9/1692 33/503 |
| 8,763,267 | B2 * | 7/2014 | Duportal | G01B 5/008 33/503 |
| 8,978,261 | B2 * | 3/2015 | McFarland | G01B 21/045 33/503 |
| 2003/0084584 | A1 | 5/2003 | Osterstock | |
| 2003/0178901 | A1 | 9/2003 | Erten | |
| 2006/0130349 | A1 * | 6/2006 | Jordil | G01B 5/012 33/559 |
| 2008/0235969 | A1 * | 10/2008 | Jordil | G01B 5/008 33/503 |
| 2008/0271332 | A1 * | 11/2008 | Jordil | G01B 5/008 33/503 |
| 2009/0025463 | A1 * | 1/2009 | McFarland | G01B 21/045 73/104 |
| 2009/0082986 | A1 * | 3/2009 | Pettersson | G01B 21/042 702/95 |
| 2009/0106994 | A1 * | 4/2009 | Gomez | G01B 5/004 33/503 |
| 2013/0212890 | A1 | 8/2013 | Vullioud | |
| 2013/0212891 | A1 | 8/2013 | Mariller | |
| 2017/0191815 | A1 * | 7/2017 | Chardonnens | G01B 5/012 |
| 2018/0073871 | A1 * | 3/2018 | Polidor | G01B 5/008 |

FOREIGN PATENT DOCUMENTS

| | | |
|---|---|---|
| EP | 1523049 A2 | 4/2005 |
| EP | 1672309 A1 | 6/2006 |
| EP | 2629048 A2 | 8/2013 |
| WO | 02101329 A1 | 12/2002 |

* cited by examiner

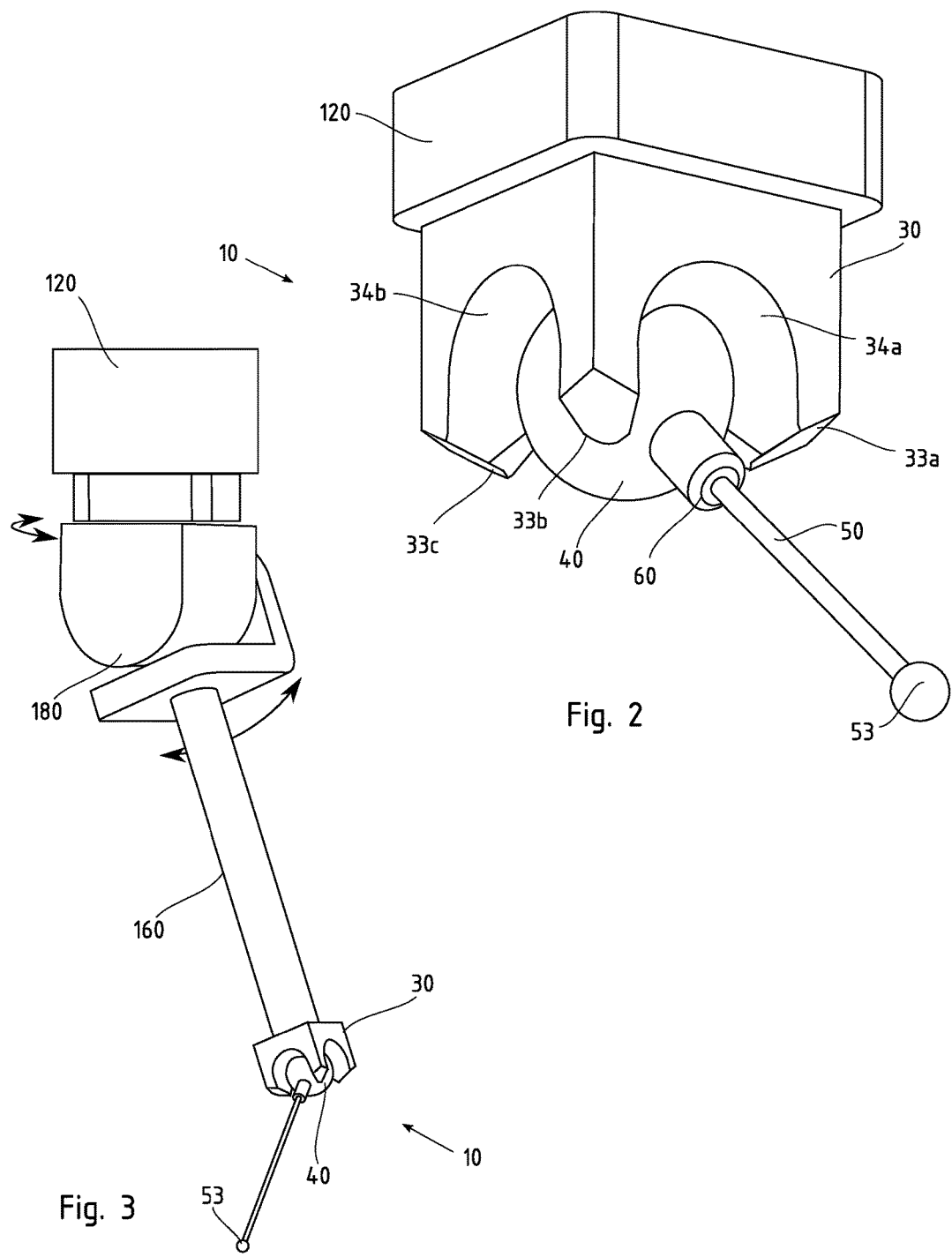

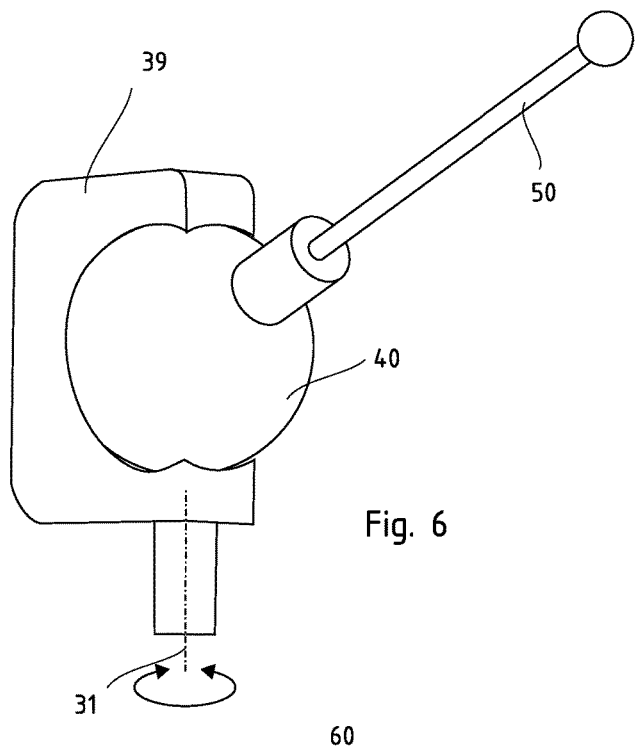
Fig. 6
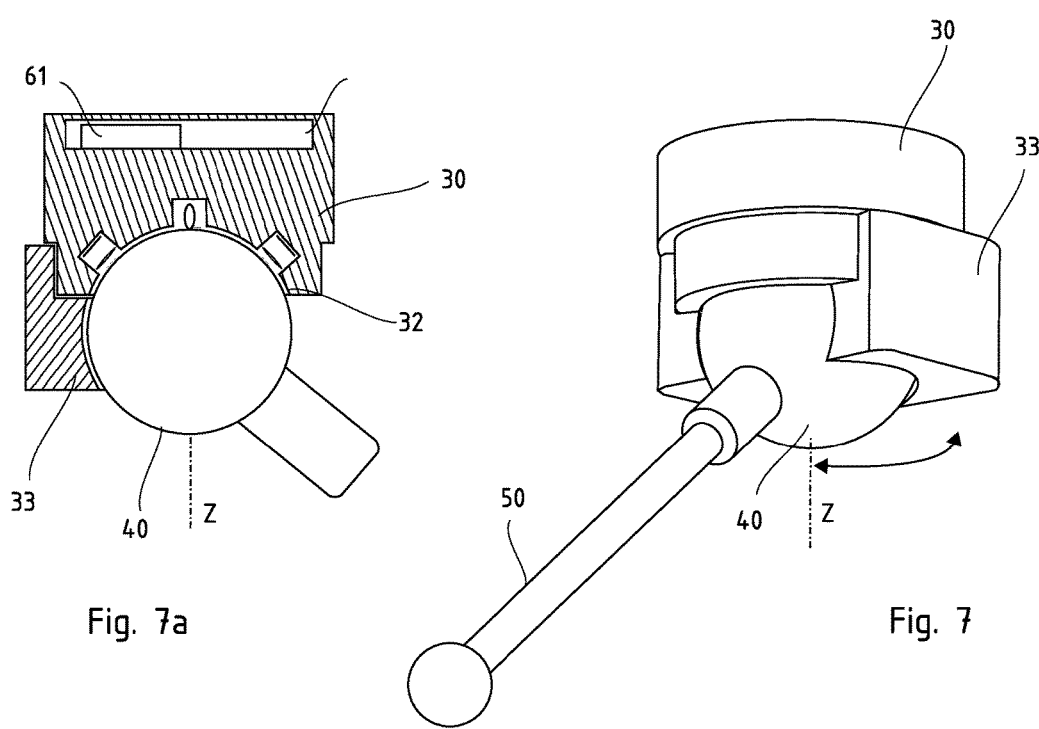
Fig. 7a
Fig. 7

MOTORIZED ORIENTABLE HEAD FOR MEASURING SYSTEM

FIELD OF THE INVENTION

The present invention concerns, in embodiments, the field of coordinate measurements and, in particular, an articulating probe head to which a measuring probe can be attached for measuring a workpiece in a coordinate measuring machine (CMM). The articulating head of the invention includes a spherical joint and is rotatable about three axes.

DESCRIPTION OF RELATED ART

Articulating probe heads, in particular motorized probe heads, are known and have been described for example in EP1672309. Articulating probe heads are attached to the moving arm of a CMM to modify the angular position of the measurement probe with respect to the moving arm. Various types of measurement probes can be attached to the probe head in an exchangeable way, preferably in automatic fashion, to allow different types of measurements to be performed on the work piece. The measurement probe can be of contact or non-contact type to measure the three-dimensional coordinates of a work piece. Other types of measurement probes can also be used, for example to image or to sense the surface of the work piece using tactile, optical, inductive, capacitive or magnetic means. The probe can be used for surface inspection as well, to detect defects or measure roughness or temperature. The articulating probe head incorporates at least one, preferably two axes of rotation which orient the measurement probe with respect to the moving arm of the CMM. The probe head can include additional degrees of freedom, for example a third axis of rotation where the measurement probe rotates on its own longitudinal axis. For simpler realizations, such as a probe head with a single axis of rotation, the term probe holder is also used.

Many conventional realizations in this field of endeavour consist in a chain of revolute joints in series: for example, starting from the quill of a CMM, a first joint that allows the rotation of an intermediate elements about a vertical axis, and a second joint, with a horizontal rotation axis, attached to the intermediate element. While such device allow to set the inclination of the coordinate probe at will, they present some shortcomings: the required multiplicity of joints plus, in the case of a motorized device, their ancillary actuators and angle encoders increases bulk, weight, and cost. Each joint contributes to errors and slackness.

Complex movements of the probe require a coordinated action on both rotation axis and, in some cases, also on the linear axis of the CMM. The mass of the probe head is therefore a source of dynamic forces that affect negatively the precision and speed of the measures. What is more, the bulk of the probe head introduces 'dead spaces' that are not available to coordinate measurement.

Another inconvenient of the known articulating heads is that the coordinate probe and the head require the connections for electric signals, power supply, compressed air, optical signals, and other. Each joint represents an obstacle to these wiring that must be crossed by flexible connections or slip rings. A shorter chain of joints is therefore advantageous.

There are in the art some example of coordinate probes with include a spherical joint. U.S. Pat. No. 5,848,477 and EP1397641, for example, disclose CMMs with a passive spherical joints for the alignment of their probes. The joints are not motorized and their configuration is not made available by encoders. They can be selectively blocked, and their rotation is either manual or by the action of the linear axis of the CMM when the probe is blocked, Hence they cannot be reoriented continuously during free motion or coordinate measurements.

The background art includes also actuators realizing spherical motion, for example CN201188587, EP1523049, and EP0741420, disclosing piezoelectric devices to this effect.

Multi-dimensional encoders based on the imaging a two-dimensional code are also known in the art. EP2629048 discloses an application of such encoders to the domain of metrology.

There is therefore a need for, and it is an aim of the present invention to provide a probe head connectable between a CMM and a coordinate probe that allows the orientation of the latter and is smaller and lighter than the devices known in the art, overcoming the limitations presented above.

BRIEF SUMMARY OF THE INVENTION

According to the invention, these aims are achieved by means of the object of the appended claims.

BRIEF DESCRIPTION OF THE DRAWINGS

The invention will be better understood with the aid of the description of an embodiment given by way of example and illustrated by the figures, in which:

FIG. 2 illustrates schematically a variant of the present invention that has cutouts to extend the angular interval that can be reached by the probe.

FIG. 3 shows a possible use of an orientable head according to the invention on an extension arm.

FIG. 6 is a schematic conceptual representation of a variant of the head of the invention in which the support is pivotably mounted on a rotation axle to extend the angular interval that can be reached by the probe.

FIGS. 7 and 7a are a schematic conceptual representation of another variant of the head of the invention, with a ball in a shallow cup and a movable retaining element that prevents the ball form moving away from the cup without appreciably limiting its motion.

Figure 1:
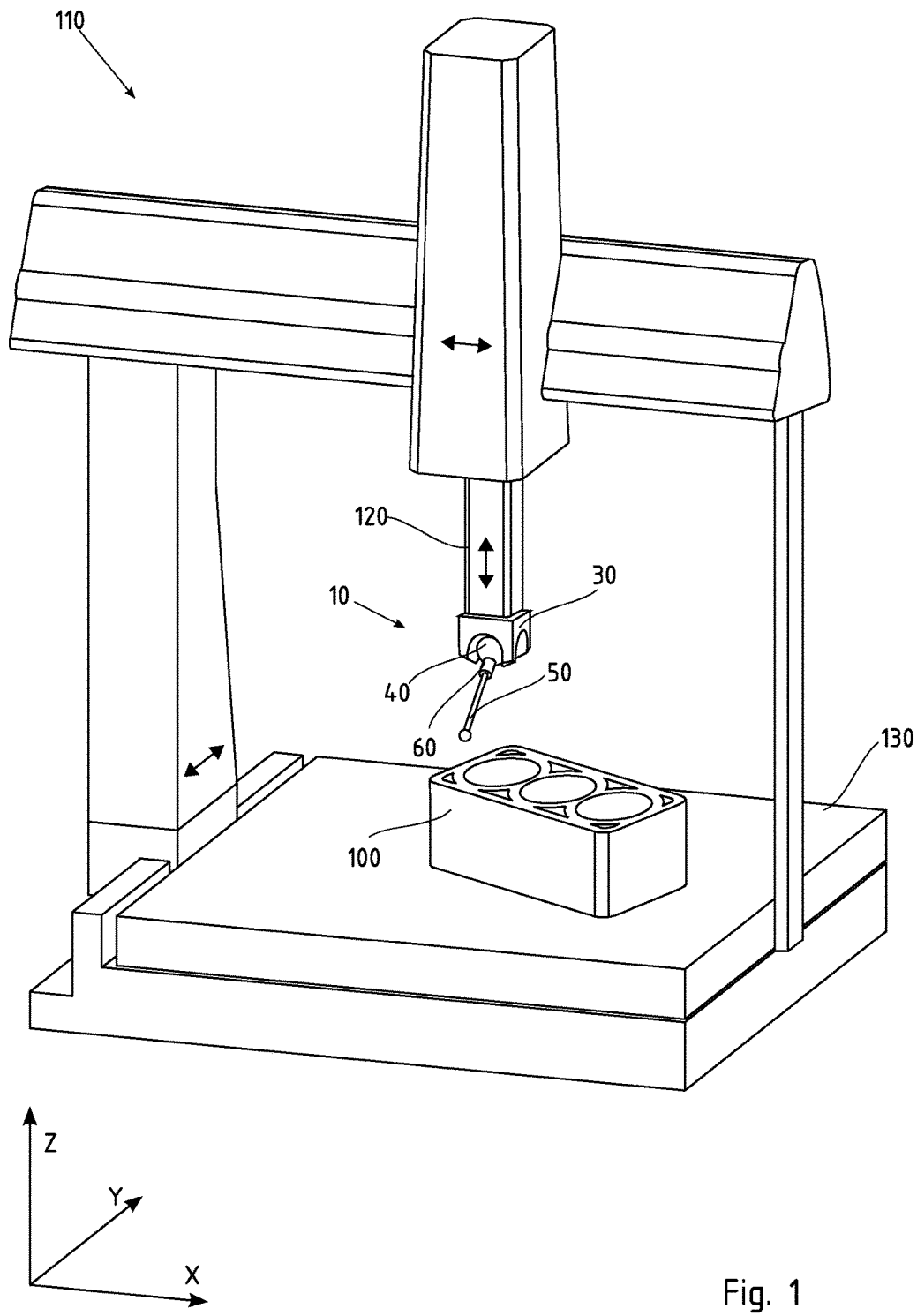
FIG. 1 shows schematically a coordinate measuring machine equipped with a motorized spherical head according to one aspect of the present invention.

Elements designated with the same reference symbol in the drawings indicate the same feature, or equivalent features.

In the following discussion, the terms 'vertical' and 'horizontal' relate to the usual orientation of probe heads in gantry-type Coordinate measuring machines. When coordinate axes are used, 'X' and 'Y' are conventionally considered as horizontal, and 'Z' as vertical. It must be understood, however, that these are not limiting features of the invention that can be used with any orientation in space.

DETAILED DESCRIPTION OF POSSIBLE EMBODIMENTS OF THE INVENTION

The following description will show various embodiment of the invention in combination with a touch coordinate probe in a CMM. Although some variants of the invention are especially targeted to this application, the invention is not so limited and also be used with scanning probes or contactless probes, such as laser interferometric probes and triangulation probes. The invention is not limited to a CMM either, and could find use in other coordinate measurement or surface sensing instruments, for example in a laser scanner surveying instrument like a theodolite, a distance meter, or a combination thereof, or in an articulated robot.

FIG. 1 illustrates a bridge-type coordinate measuring machine 110 with a positioning platform or quill 120 that can move according to three independent orthogonal axis, X, Y, Z relative to a reference plane 130, on which a workpiece 100 can be placed. An articulating probe head 10, attached to the positioning platform 120, has a spherical joint including a ball 40 rotatably retained in a socket 30.

The ball carries a coordinate probe, in this case a touch coordinate probe with a touch detector 60 arranged to sense the contact between the tip of the stylus 50 and a workpiece 100. The spherical joint consent all rigid rotations that have origin in the centre of the ball 40. It has three degrees of freedom, like a chain of three revolute joints.

FIG. 2 shows better the structure of a possible realization of the invention. The ball 40 is retained into a socket in a support 30 that is rigidly connected to the quill 120 of a coordinate measuring machine, or to another instrument. The socket is deep enough to prevent the ball from falling, yet it is not axially symmetric in this example: a number of cut-outs 34a-b are foreseen, between which the fingers 33a-c are left. In this manner, the range of angles accessible to the probe can be extended, provided the stylus in one of the cut-outs.

Importantly, the articulating head of the invention includes encoders that are able to compute the position of the ball, and of the probe 50 at any moment, as it will be detailed further on. The head is also capable of autonomous motion, such that the probe can be rotated continuously according to a predetermined trajectory. This capability can be obtained by spherical ultrasonic actuators, or spherical brushless induction motors.

FIG. 3 shows a possible use of the invention that, thanks to its reduced size and small weight, is suitable for mounting on an extension 160 attached to a conventional inclinable head 180. This combination allows the measure of complex parts, not reachable with conventional probes.

Figure 4:
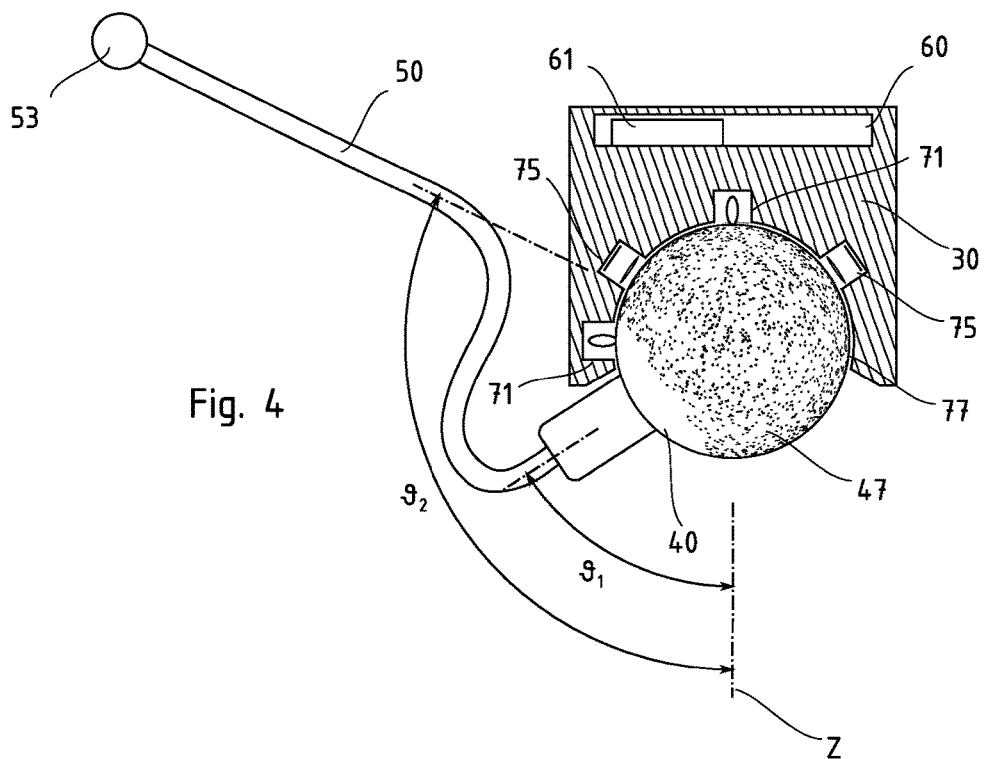
FIG. 4 illustrates schematically a variant of the present invention with its actuators and encoders, and a bent stylus.

FIG. 4 illustrates schematically a possible variant of the spherical joint of the invention. The ball 40 is rotatably retained in a cup holder 30 that has an internal spherical surface corresponding in radius to the ball 40. In the represented variant, the ball 40 is deeply lodged in the cup 30 such that it cannot be extracted without disassembling the cup. We will see in the following that this feature is not essential, and that the invention also encompasses realization in which the ball is seated in a shallow cup, not sufficient alone to prevent its separation.

The rotation of the ball 40 is generated by suitable actuators 71 that, preferably, can turn the ball according to any given rigid rotation around its centre. Several devices allow to achieve this result. For example the so-called spherical steppers or spherical induction motors rely on magnetic coils in the stator (in this case, the cup support 30) to generate a torque on permanent magnets or induction coils in the ball. Piezoelectric spherical actuators use a plurality of piezoelectric active element laid on the inner surface of the cup, that selectively push the ball in the desired manner. The invention could also include several actuators of different kind.

Preferably, the rotation of the ball is assured by an air bearing. To this effect, the air gap 77 remaining between the ball and the socket is filled by a film of compressed air. In alternative realizations, not represented, the invention could have low-friction sliders, or lubricated surfaces, instead of an air film.

Advantageously, the air bearing 77 can be activated selectively. In a variant, the air bearing 77 is pressurised when the actuators are active, and disabled otherwise, such that the ball 40 is locked in a stable orientation when actuators are at rest.

The thickness of the air bearing gap is preferably smaller than 20 µm, more preferably smaller than 10 µm. Air bearings can be made remarkably stiff, and guide the ball 40 such that, under normal dynamic loads, its centre does not move appreciably from the centre of the cup 30.

Importantly, the invention includes a workpiece detector 60 that is operatively arranged to sense when the probe touches the workpiece 100 (see FIG. 1). The contact signals triggers the CMM to record the position of the probe tip 53. For contactless probes, the detector 60 measures the distance to the workpiece. Several kinds of detectors can be used in the frame of the invention and, according to their characteristics, they can be included either in the support 30, as shown in FIG. 4, or in the mobile probe, as in FIG. 5.

Possible workpiece detectors include, but are not limited to:

Touch trigger sensors, arranged to generate an electric signal when the tip of the probe touches the workpiece;

Deflection sensors, providing a signal that represents the amount of deflection of the probe tip due to its contact with the workpiece;

Force sensors, providing a signal that represents the contact force between the probe tip and the workpiece;

Optical sensors, which give a measure of the distance between the probe tip and the workpiece's surface, without physical contact.

Sensors that provide a distance, a deflection, or a force can be unidirectional, in the sense that they measure uniquely along a predetermined direction, or omnidirectional.

The orientation of the probe in space is determined by one or a plurality of position encoders 75 in the support 30. In a preferred embodiment, the ball 40 has an optical code 47 on its surface, and the position encoders are arranged to capture images of a portion of the code that is in front of the encoder, and determine the orientation of the ball based on the captured images. By using image processing techniques, these encoders can provide relative positioning in three dimensions and also determine the angle of rotation. Most precise results, however, can be obtained by combining several encoders 75 at different known positions. Other types of position encoders can also be used, for example magnetic Hall sensors.

In an advantageous embodiment, the encoders 75 determine not only the rotation of the ball 40 in 2D on the surface of the sphere, but also the displacement in 3D of the position of its centre, within the limits allowed by the compliance of the air bearing 77. This can be achieved by combining the 2D position provided by a sufficient number of encoders at different places around the ball, or by configuring the encoders to measure the 3D position of the code as described, for example, in US20130212890 and US20130212891. Dedicated distance encoders can be also used for maximum precision.

The actuators and the encoders are preferably controlled by a micro-controller 61 that is located in the support 30.

The micro-controller communicates with the controller of the CMM via a cable or wirelessly.

The determination of the ball centre's position can be used for crash detection. When the probe incidentally hits an obstacle, the encoders determine that the ball has been pushed out of the symmetric position, and raises an alarm signal that triggers corrective action (usually stopping the machine) in the CMM controller.

In a variant, the determination of the ball centre's position can be used to detect the exact instant of a planned contact between the tip and the workpiece, or the contact force. In this manner, the function of the workpiece detector 60 can be implemented by the spherical encoder or encoders 75.

Another manner of implementing the workpiece detector 60 with the encoders 75 would be to bring the probe's tip 53 in contact with the workpiece and operate the actuators 71 such that they exert a given torque on the ball, whereupon the tip pushes the workpiece with a corresponding force. The probe can be caused to slide along a line on the workpiece, continuously scanning its coordinates in the process.

The inclination of the ball 40 in the embodiment of FIG. 4, is limited to angles up to $\vartheta_1$ with respect to the vertical axis Z. The stylus 50 of the touch probe is bent, however, such that the touch tip 53 can be raised up to angle $\vartheta_2$ that is quite broader. It can be seen that, thanks to the three degrees of freedom of the ball 40, the probe can reach any point up to an angle $\vartheta_2$ relative to the 'Z' axis. The combination of a bent stylus with a spherical joint allows to extend the reach of the probe.

Figure 5:
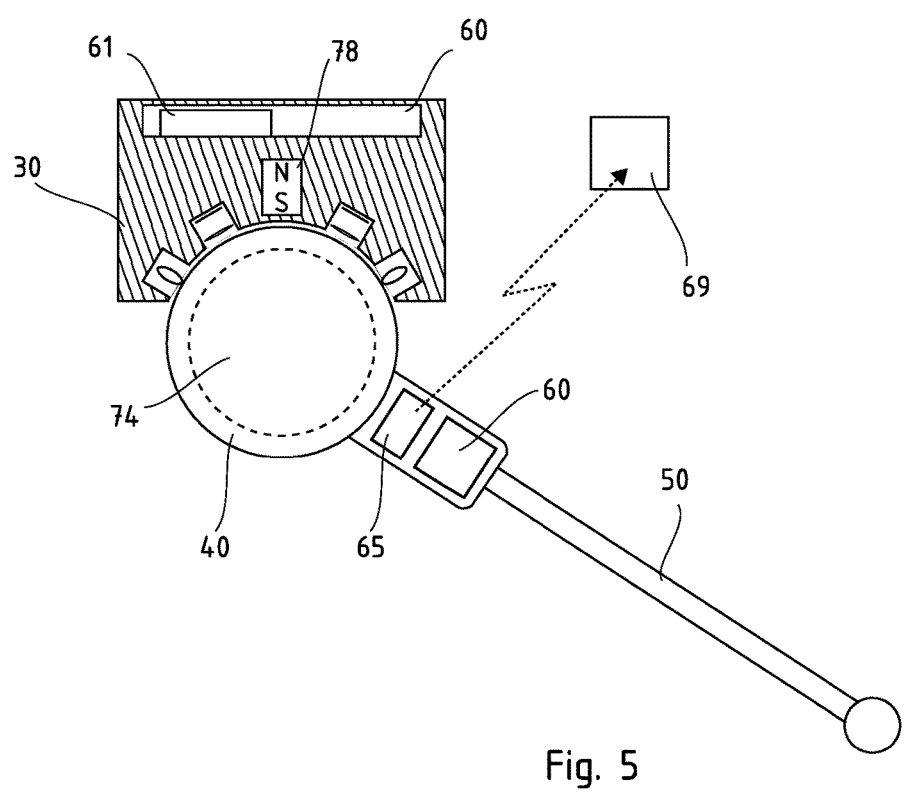
FIG. 5 illustrates schematically another variant of the inventive head with a ball lodged in a shallow cup, a magnetic retaining device, and a wireless link.

The embodiment of FIG. 5 differs from the previous one in that the cup 30 that holds the ball 40 is shallower and does not extend to a half-sphere. The ball 40, therefore, would fall if it were not retained by magnet 78 that acts on a magnetic core 74 in the ball. This arrangement increases the possibility of motion of the ball and allows an easier swap of the ball 40 with another, equipped with a different probe.

The probe of FIG. 5 is equipped with a straight touch pin 50 and the workpiece detector 60 is lodged in the base of the pin 50. Preferably, the workpiece detector communicates with an external unit 69 via a wireless interface 65, which could be a radio link, an inductive link, a RFID link, an optical signalling device, or any suitable wireless communication means. Preferably, the detector 60 includes also an autonomous rechargeable battery, and has means for recharging it.

FIG. 6 illustrates another variant of the inventive head in which the ball is held in a pivoting support 39, which allows additional freedom of movement. The pivoting support includes preferably the elements that have been shown in previous embodiments, namely an air bearing or a sliding bearing, encoders, and actuators, to move the ball and determine its orientation. The support can rotate around the axle 31 thanks to a conventional rotary actuator that is operated as an additional axis of a coordinate measuring machine.

A further advantage of the embodiment of FIG. 6 is that the support 39 can be operated such as to be essentially opposite the probe 50, as a counterweight, reducing in this manner the dynamic forces induced by rapid swinging of the probe 50.

The variants of FIGS. 7 and 7a also addresses the problem of increasing the probe accessible region. The ball 40 is guided by a holder 30 that has a hollow cup 32, which consents an ample range of rotations, but is not deep enough to retain the ball. The holder includes, as in previous examples, encoders and actuators for reading and changing the ball's orientation, and an air bearing or a sliding bearing.

The ball 40 cannot move away from the cup 32 because the mobile finger 33 prevents it. Suitable actuators (not shown) automatically turn the mobile finger around the 'Z' axis in such a way that the rotation of the ball is not hindered. For example, the mobile finger 33 can be positioned opposite to the probe 50 and, in this manner also acts as dynamic counterweight.

REFERENCE NUMBERS

10 orientable head
30 support
31 rotation axis
32 cup
33 mobile finger
33*a-c* fingers
34*a-b* cut-outs
39 pivoting support
40 ball
47 code
50 stylus
53 touch feeler
60 touch detector
61 microcontroller
65 wireless interface
69 wireless interface
71 actuator
74 magnetic element
75 optical sensor
77 clearance, air bearing
78 magnet
100 workpiece
110 coordinate machine
120 quill, positioning platform
130 reference plane
160 extension
180 orientable head
X, Y, Z Cartesian axis
$\vartheta_1$, $\vartheta_2$ inclination angle

We claim:

1. An inclinable measuring head connectable to a positioning platform of a coordinate positioning system for orienting a coordinate measuring probe relative thereto, the inclinable measuring head comprising a support element and a probe holder rotatably linked to the support element by a spherical joint, whereby the probe holder has a connector for removably attaching a coordinate measuring probe and is capable of being rotated about three independent axis, the measuring head further comprising a 3D optical position encoder providing relative orientation of the probe holder relative to the support element, and an actuator arranged for orienting the probe holder relative to the support element about said three independent axis.

2. The inclinable measuring head of the claim 1, wherein said actuator is a piezoelectric actuator or an induction brushless actuator.

3. The measuring head of the claim 1, wherein the orientation change of the probe holder is such that one geometric point of the probe holder remains immobile relative to the support element.

4. The measuring head of the claim 1, wherein the spherical joint comprises one or more than one air bearings.

5. The measuring head of the claim 1, wherein said connector includes electric and/optical connections for transmitting electric and/or electric optical signals between the coordinate measuring probe and the positioning platform of said coordinate positioning system.

6. The measuring head of the claim 1, comprising a wireless transceiver.

7. The measuring head of the claim 6, wherein the wireless transceiver includes a rechargeable power source.

8. The measuring head of the claim 1, in combination with an extension arm connectable between the measuring head and the positioning platform.

9. The measuring head of the claim 1, wherein said spherical joint includes a ball rotatably guided in a socket that includes a plurality of cut-outs that allows orienting the coordinate measuring probe above an equatorial horizontal plane.

10. The measuring head of the claim 1, in combination with a coordinate measuring probe having a bent stylus.

11. The measuring head of the claim 1, wherein said spherical joint includes a ball rotatably guided in a socket, the socket having a concave spherical cap surface that has a radius corresponding to the radius of the ball and is smaller than one half of the ball.

12. The measuring head of the claim 11, further comprising a retaining element that limits or prevents a motion of the ball out of the socket.

13. The measuring head of the claim 12, wherein said retaining element is a magnet.

14. The measuring head of claim 12, wherein said retaining element is mobile.

15. The measuring head of the claim 1, wherein said spherical joint includes a ball rotatably guided by two opposite polar supports, such that the ball is capable of being rotated around its centre that is remains fixed, said opposite polar supports being connected by a link that is pivotably connected to said support element.

16. The measuring head of the claim 1, wherein said encoder comprises one image sensor or more than one image sensors in the support element, arranged to determine the orientation of the probe holder relative to the support element based on imaging a pattern on the probe holder.

17. The measuring head of the claim 16, wherein the position encoder is operatively arranged to detect a contact condition between the coordinate measuring probe and a workpiece whose coordinates are measured.

* * * * *